United States Patent [19]
Lee et al.

[11] Patent Number: 6,046,927
[45] Date of Patent: Apr. 4, 2000

[54] NONVOLATILE SEMICONDUCTOR MEMORY DEVICE, A METHOD OF FABRICATING THE SAME, AND READ, ERASE WRITE METHODS OF THE SAME

[75] Inventors: Jong-ho Lee, Kyunggi-do; In-Seon Park, Seoul; Cha-Young Yoo, Kyunggi-do, all of Rep. of Korea

[73] Assignee: Samsung Electronics Co., Ltd., Suwon, Rep. of Korea

[21] Appl. No.: 09/177,569

[22] Filed: Oct. 23, 1998

[30] Foreign Application Priority Data

Oct. 25, 1997 [KR] Rep. of Korea .................... 97-55034

[51] Int. Cl.$^7$ .................................................. G11C 11/22
[52] U.S. Cl. ............................................ 365/145; 365/149
[58] Field of Search ................................... 365/145, 149, 365/65, 117

[56] References Cited

U.S. PATENT DOCUMENTS 5,373,463  12/1994  Jones, Jr. ................................ 365/145

*Primary Examiner*—David Nelms
*Assistant Examiner*—David Lam
*Attorney, Agent, or Firm*—Jones Volentine, L.L.P.

[57] ABSTRACT

A ferroelectric memory device includes a silicon-on-insulator substrate having a handling wafer, a first insulating layer, and a semiconductor layer. It also includes a first conductive layer used as a bit line formed in the first insulating layer, a source region formed in the semiconductor layer, a drain region formed in the semiconductor layer, a second insulating layer formed over the semiconductor layer between the source and drain regions, a second conductive layer for use as both a lower electrode and gate electrode, formed over the second insulating layer between the source and drain regions, a ferroelectric layer formed over the semiconductor layer, and a third conductive layer for use as an upper electrode formed over the ferroelectric layer. For reading, writing, and erasing, different voltages are applied to the upper electrode and the semiconductor layer between the drain and source. For writing, the upper electrode receives a writing voltage, and the semiconductor layer receives a ground voltage. This brings the drain and source to a floating state to either invert polarization of the ferroelectric layer or retain initial polarization, depending upon the data. For erasing, the upper electrode receives an erasing voltage, and the semiconductor layer receives a ground voltage. This brings the drain and source to a floating state. For reading, the upper electrode receives a reading voltage, and the semiconductor layer receives a ground voltage. A sensing current is then provided to the drain, and potential variation is sensed on the bit line.

21 Claims, 6 Drawing Sheets

NONVOLATILE SEMICONDUCTOR MEMORY DEVICE, A METHOD OF FABRICATING THE SAME, AND READ, ERASE WRITE METHODS OF THE SAME

This application relies for priority upon Korean Patent Application No. 97-55034, filed on Oct. 25, 1997, the contents of which is herein incorporated by reference in its entirety.

FIELD OF THE INVENTION

The present invention relates to semiconductor memory device and, more particularly to a ferroelectric memory device of a non-destructive read-out type, and a fabricating method thereof. The present invention also relates to read, erase, and write methods of the ferroelectric memory device.

BACKGROUND OF THE INVENTION

Up to the present, memory system designs have combined a variety of memory devices such as semiconductor memory devices (e.g., dynamic RAM, static RAM, flash memory), magnetic discs, and the like. Because of this, it is very difficult to support all of the memory spaces of certain electronic devices, such as personal computers, by using only one sort of memory device.

In the field of semiconductor memories in particular, the development of devices to meet high density, high-speed read/write operations, meet desired access times, achieve low power consumption, etc. have long been required, but there are inevitable limits, as shown by conventional memory devices.

In order to solve the problems stated above, a ferroelectric memory that retains data even when powered off has been created through the use of a ferroelectric material such as a lead zirconate titanate (PZT) exhibiting hysterisis characteristics. Several examples of such ferroelectric memory techniques have been disclosed in the IEEE Journal of Solid-State Circuits, vol. 23, No. 5, pp. 1171~1175, October 1988, which is entitled "An Experimental 512-bit Nonvolatile Memory with Ferroelectric Storage Cell."

As is well known in this art, a ferroelectric material has spontaneous polarization characteristics. Directions of the spontaneous polarization are controlled in accordance with directions of an applied electric field. Typical ferroelectric materials, such as an $ABO_3$ type of $PbZrO_3$ molecule may be given as an example. In this example, a metal atom, i.e., zirconium (Zr) which is positioned at the center of the $PbZrO_3$ molecule has two stable state points in accordance with the two possible directions of an applied electric field. Given this zirconium displacement, the zirconium is located in the range of the stable state points. As a result, the ferroelectric material exhibits hysterisis characteristics in an electric field, depending upon the degree of polarization.

A ferroelectric random access memory ("FRAM") is one such semiconductor memory device that uses the hysterisis characteristics of a ferroelectric material. FRAMs achieve nonvolatile storage characteristics by corresponding their degree of polarization to binary data. They are thus capable of performing read/write operations by using a very fast inversing speed of polarization.

Read and write operation of an FRAM can be carried out by polarization reversion, and therefore an operation speed of an FRAM is determined by the time of polarization reversion. The speed of polarization reversion of the ferroelectric capacitor is determined by a capacitor area, a thickness of ferroelectric thin film, an applied voltage, etc., and the unit of the speed of polarization reversion is normally in the range of microseconds ($\mu s$). This means that the FRAM can be operated faster than electrically erasable and programmable read only memories (EEPROMs) or flash memories.

FIG. 1 is a graph showing a hysterisis I-V switching loop of a ferroelectric capacitor. In this graph, the abscissa indicates a potential difference between both electrodes of the ferroelectric capacitor, i.e., a voltage between both ends of the capacitor. The ordinate of this graph shows the amount of charge induced to a surface of ferroelectric material in accordance with spontaneous polarization, i.e., the degree of polarization ($\mu C/cm^2$).

As shown in FIG. 1, if no electric field is applied to the ferroelectric material that has a zero voltage applied to it, polarization is not mostly caused in domains of polarization. When a voltage is increased in a positive direction of the graph, the degree of polarization is increased from zero up to a point "A" inside the positive charge polarization domain. At the point "A," all of the domains are polarized in one direction and the degree of polarization is maximized. In this case, the degree of polarization, i.e., the amount of charge contained in the ferroelectric material may be indicated as $Q_s$ and the applied voltage as the operation voltage $V_{cc}$. After this, even though the voltage is lowered again to zero voltage, the degree of polarization is not reduced to zero, but remains at a point "B." The charge amount of the ferroelectric material, i.e., a remaining degree of polarization obtained by remaining polarization may be depicted as $Q_r$.

Next, if a voltage is decreased in a negative direction of the graph, the degree of polarization is changed from the point "B" to a point "C" inside the negative charge polarization domain. At the point "C," all of the domains of the ferroelectric material are polarized in a reversed direction with respect to the polarization direction at the point "A." The degree of polarization is then indicated as $-Q_s$, and the applied voltage as the operation voltage $-V_{cc}$. After this, even though the voltage is again brought to zero voltage, the degree of polarization does not go to zero, but remains at a point "D." The remaining degree of polarization may be depicted as $-Q_r$. If the voltage is increased once more in the positive direction, the degree of polarization is changed from the point "D" to the point "A."

As mentioned immediately above, if a voltage used to cause an electric field is applied once to a ferroelectric capacitor whose ferroelectric material is inserted between two electrodes, the polarization direction according to the spontaneous polarization can be continuously maintained, even though the electrodes are later set to a floating state. Because of this spontaneous polarization, surface charges of the ferroelectric material are not spontaneously dissipated due to leakage. Thus, if the voltage is not applied such that the degree of polarization is at a zero state, the polarization direction continues to be maintained.

As well-known in this art, FRAMs are divided into two classes. One class is called a destructive read-out type ("DRO-type") where data stored in a memory cell is destroyed (or lost) during a read mode of operation. The other class is called a non-destructive read-out type ("NDRO-type") where data stored in a memory cell is not destroyed (or lost) during the read mode of operation.

In the DRO-type FRAM, a unit memory cell consists of one switching transistor and one ferroelectric capacitor (1T/1C) or of two switching transistors and two ferroelectric capacitors (2T/2C), as disclosed in U.S. Pat. No. 4,873,664 ("the '664 patent.) This allows the FRAM to reverse a polarization direction of ferroelectric material sandwiched between a lower electrode and an upper electrode of a ferroelectric capacitor. According to the '664 patent, in the former situation, a memory cell comprises one transistor and one capacitor per one bit and one dummy memory cell, i.e. the reference cell, is provided in the memory cell. In the latter situation, a memory cell comprises two transistors and two capacitors per one bit and a dummy memory cell is not provided in the memory cell. A pair of complementary data is stored in a pair of ferroelectric capacitors.

The DRO-type FRAM operates in a manner similar to that of a dynamic random access memory device except that a refresh operation is not required. But, since data stored in the DRO-type FRAM is read by reversing a polarization direction of a ferroelectric capacitor, it suffers a disadvantage that a rewrite operation (or a writeback operation) must be performed after the read operation to return the ferroelectric capacitor to its proper polarization.

Such methods and devices in which data stored in a memory cell is not destroyed (or lost) during the read mode of operation have been investigated. The NDRO-type FRAM proposed as one such device is disclosed in U.S. Pat. No. 5,753,949 under the title of "FERROELECTRIC MEMORY." The basic structure and operation for an NDRO-type FRAM cell are described in detail in U.S. Pat. No. 5,753,949.

Other NDRO-type FRAMs are disclosed in U.S. Pat. No. 5,345,414 ("the '414 patent") under the title of "SEMICONDUCTOR MEMORY DEVICE HAVING FERROELECTRIC FILM" and in U.S. Pat. No. 5,519,812 ("the '812 patent") under the title of "FERROELECTRIC ADAPTIVE-LEARNING TYPE PRODUCT-SUM OPERATION ELEMENT AND CIRCUIT USING SUCH ELEMENT."

The NDRO-type FRAM device disclosed in the '414 patent uses plural memory cells, each of which includes three transistors, i.e., a writing and erasing transistor, a storing transistor, and a reading transistor. However, since one memory cell is made up of three transistors, the device is unsuited to a high integrity. The NDRO-type FRAM device disclosed in the '812 patent is used as a resistor element of a neuron circuit, but not as a memory element. Given its structure, a writing operation is possible, but a reading operation is impossible.

Furthermore, in a case of manufacturing a memory cell according to the aforementioned methods ('414 and '812 patents), a ferroelectric lattice structure, i.e., a perovskite structure, can be destroyed by a critical chemical reaction or a mutual diffusion between a ferroelectric material, for example, PZT or SBT, and Si (or $SiO_2$). Therefore, it is another limitation of the aforementioned devices ('414 and '812 patents) that due to a shortness of Pt (lead) in the ferroelectric material, the ferroelectric characteristics may decline.

SUMMARY OF THE INVENTION

It is therefore an object of the present invention to provide a method of manufacturing a ferroelectric memory device of a metal-ferroelectric-metal-insulator-semiconductor (MFMIS) field effect transistor.

It is another object of the invention to provide a ferroelectric memory device capable of being read, write, and erase operations.

It is still another object of the invention to provide reading, writing and erasing methods of a ferroelectric memory device using a MFMIS field effect transistor as a memory cell.

In order to attain the above objects, according to an aspect of the present invention, there is provided a ferroelectric memory device. The device comprises a silicon-on-insulator substrate including a handing wafer, a first insulating layer, and a semiconductor layer sequentially formed, a bit line formed in the first insulating layer, a memory cell having a source formed in the semiconductor layer and connected to the bit line, a drain formed in the semiconductor layer, a lower electrode formed on the second insulating layer, a ferroelectric layer formed over the semiconductor layer, and an upper electrode formed on the ferroelectric layer, wherein the lower electrode, gate insulating layer, drain, and source form a field effect transistor, a writing circuit for writing data to be written into the memory cell by applying a writing voltage to the upper electrode so as to invert a direction of a polarization of the ferroelectric layer or retain the polarization in an initial direction in accordance with the data, and a reading means for reading data to be read from the memory cell by applying a reading voltage to the upper electrode and by checking whether the field effect transistor is conductive.

The drain and source preferably remain at a floating state when the writing voltage is applied to the upper electrode. The semiconductor layer between the source and the drain is preferably grounded when the writing voltage is applied to the upper electrode. The writing voltage is preferably a voltage sufficient for a polarization of the ferroelectric layer to be reversed and the reading voltage is a voltage at which the polarization of the ferroelectric layer is not reversed.

Data stored in the memory cell is preferably erased by applying an erasing voltage to the upper electrode so as to invert a direction of a polarization of the ferroelectric layer or retain the polarization in an initial direction. The semiconductor layer between the source and the drain is preferably grounded when the erasing voltage is applied to the upper electrode. The erasing voltage is preferably a voltage sufficient for a polarization of the ferroelectric layer to be reversed and having both a polarity contrary to and the same level as the writing voltage. The drain and source preferably remain at a floating state when data stored in the memory cell is erased. The semiconductor layer between the source and the drain is preferably grounded when the erasing voltage is applied to the upper electrode.

There is also provided a method of fabricating a nonvolatile memory device, including the steps of forming a first insulating layer over a semiconductor layer, forming a contact hole by etching the first insulating layer until at least a portion of the semiconductor layer is exposed, depositing a first conductive layer over the first insulating layer and in the contact hole, forming a second insulating layer over the first conductive layer, bonding a handing wafer to the second insulating layer to form a silicon-on-insulator substrate, doping the semiconductor layer with an impurity of a first conductive type, sequentially depositing a third insulating layer and a second conductive layer over the semiconductor layer, on a side opposite the first and second insulating layers, forming source and drain regions of a second conductive type in the semiconductor layer by use of a photoresist pattern as a mask, etching the second conductive layer using the photoresist pattern as a mask until a surface of the third insulating layer is exposed, to form a lower electrode, forming a ferroelectric layer over the third insulating layer, and forming an upper electrode over the ferroelectric layer, wherein the ferroelectric layer coats an entire cell array area.

The first and second insulating layers are preferably made of $SiO_2$. The first conductive type is preferably P-type and the second conductive type is preferably N-type. The first conductive layer preferably comprises polysilicon. The first conductive layer preferably serves as a bit line. The second insulating layer preferably comprises a material selected from the group consisting of $SiO_2$, $TiO_2$, $Y_2O_3$, $Ce_3$, $SrTiO_3$, and $BaSrTiO_3$. The conductive layer preferably comprises a material selected from the group consisting of Pt, $IrO_2$, and $RhO_2$.

The step of forming the ferroelectric layer may further include the steps of coating a ferroelectric material over the third insulating layer and the lower electrode, and heating the ferroelectric material so that the ferroelectric material attains a ferroelectric lattice structure, whereby the ferroelectric layer over the lower electrode has a better ferroelectric lattice structure than that over the third insulating layer and no interference is caused between adjacent memory cells. The ferroelectric material preferably comprises a material selected from the group consisting of PZT, SBT(SrBiTa), and a compound of PZT and $PbTiO_2$.

The upper electrode, the ferroelectric layer, and the lower electrode may together form a ferroelectric capacitor. The lower electrode, the third insulating layer, the source region, and the drain region may together form a field effect transistor. The upper electrode may serve as a word line.

BRIEF DESCRIPTION OF THE DRAWINGS

The present invention will be described by way of exemplary embodiments, but not limitations, illustrated in the accompanying drawings in which like reference numbers denote similar elements, and in which.

DESCRIPTION OF THE PREFERRED EMBODIMENT

Hereinafter, a preferred embodiment of the present invention will be described with reference to the drawings.

Figure 2:
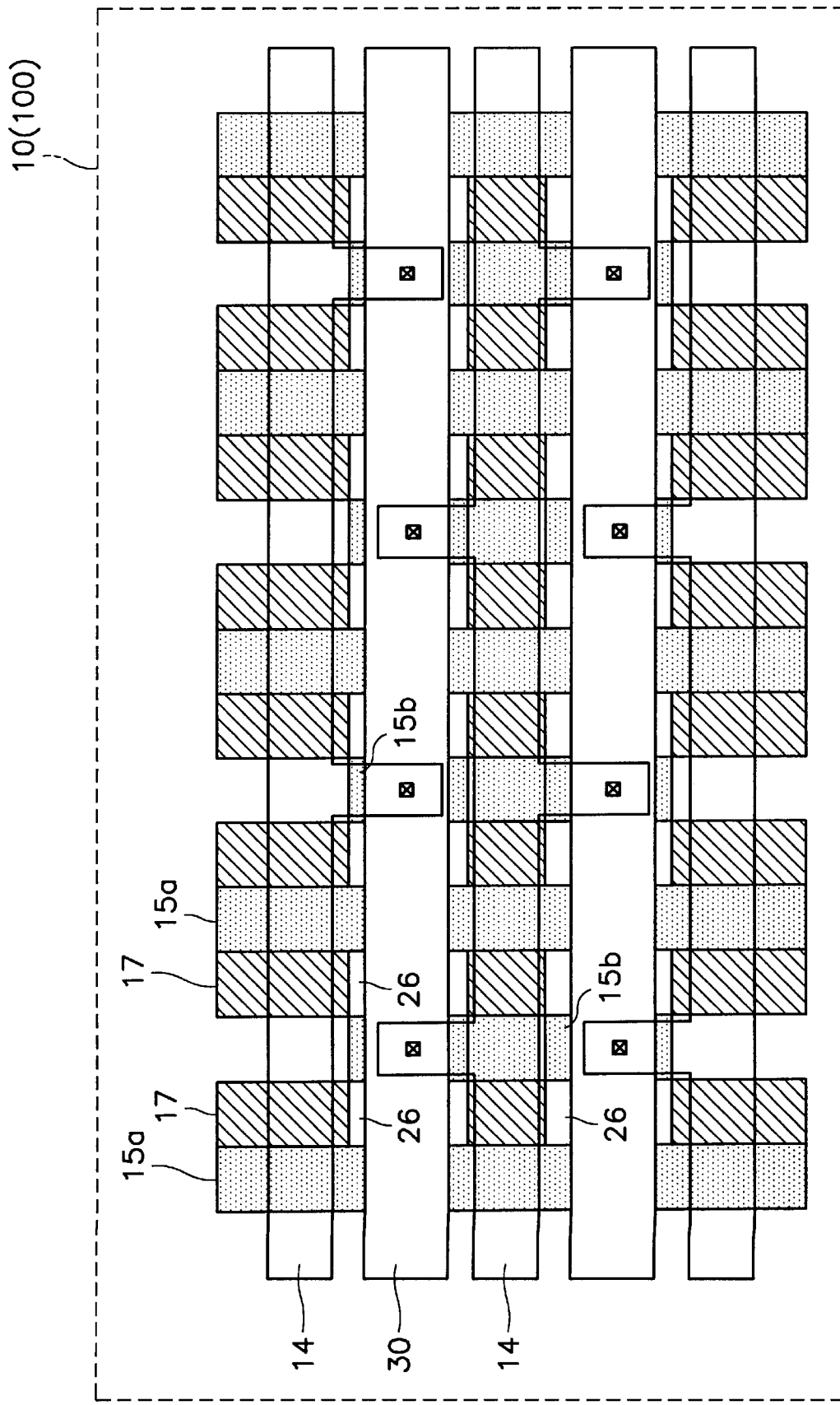
FIG. 2 is a top view showing a cell array layout structure of a ferroelectric memory device according to a preferred embodiment of the present invention.

FIG. 2 is a top view of a ferroelectric memory device according to a preferred embodiment of the present invention, and FIGS. 3A to 3F are cross-sectional views for describing a method of manufacturing a ferroelectric memory device according to a preferred embodiment of the present invention.

Figure 3A:
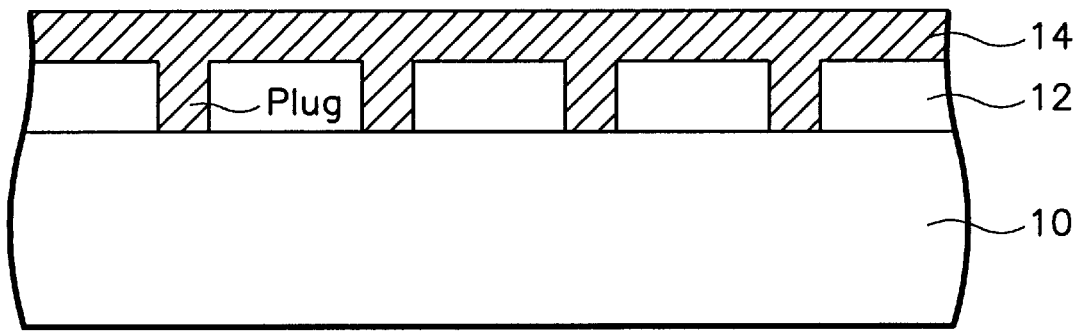
FIGS. 3A to 3F are cross-sectional views for describing a method of manufacturing a ferroelectric memory device according to a preferred embodiment of the present invention.

Referring to FIG. 3A, a first insulating layer 12, such as $SiO_2$, is deposited over a semiconductor layer 10 by use of an well-known method, e.g., chemical vapor deposition (CVD). In the first insulating layer 12, contact holes are formed using an well-known photo-etch process, and then a first conductive layer 14, such as polysilicon, is deposited over the first insulating layer 12 and in the contact holes. A part of the first conductive layer 14 is preferably electrically connected to a surface of the semiconductor layer 10 through the contact holes, and the portion of the first conductive layer 14 in the contact it holes is called a "plug." The first conductive layer 14 is used as a bit line, as described below in FIG. 4.

Figure 3B:
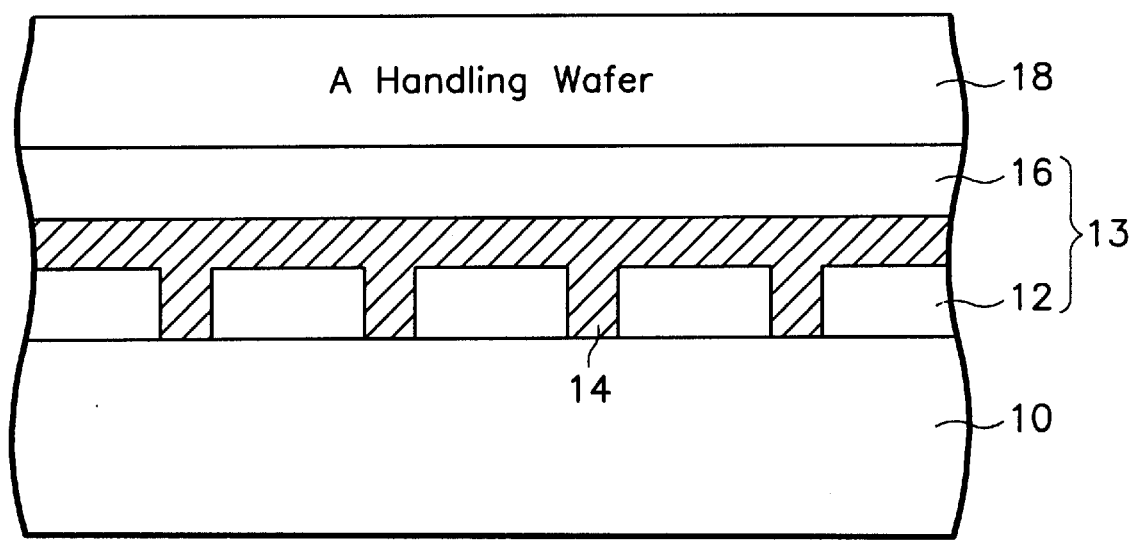
Figure 3C:
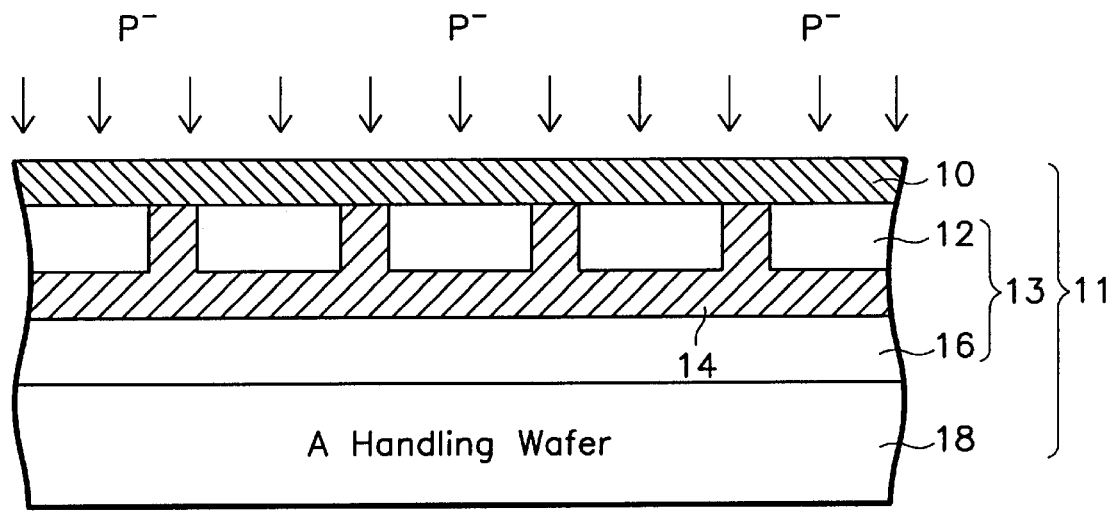

As shown in FIG. 3B, a second insulating layer 16, such as $SiO_2$, is deposited over the first conductive layer 14, and then a handling wafer 18 is bonded on the second insulating layer 16. One possible bonding method is described in U.S. Pat. No. 5,705,421 under the title of "A SOI SUBSTRATE FABRICATING METHOD." Successively, a silicon-on-insulator ("SOI") substrate 11 is formed by chemically and mechanically polishing the semiconductor layer 10 so as to have a predetermined thickness as illustrated in FIG. 3C. Herein, the first and second insulating layers 12 and 16 serve as an insulator of the SOI substrate 11. A P-type impurity of a low concentration (P⁻) is then entirely implanted in the semiconductor layer 10, so that the semiconductor layer 10 is doped by the P (or P⁻) impurity type.

Figure 3D:
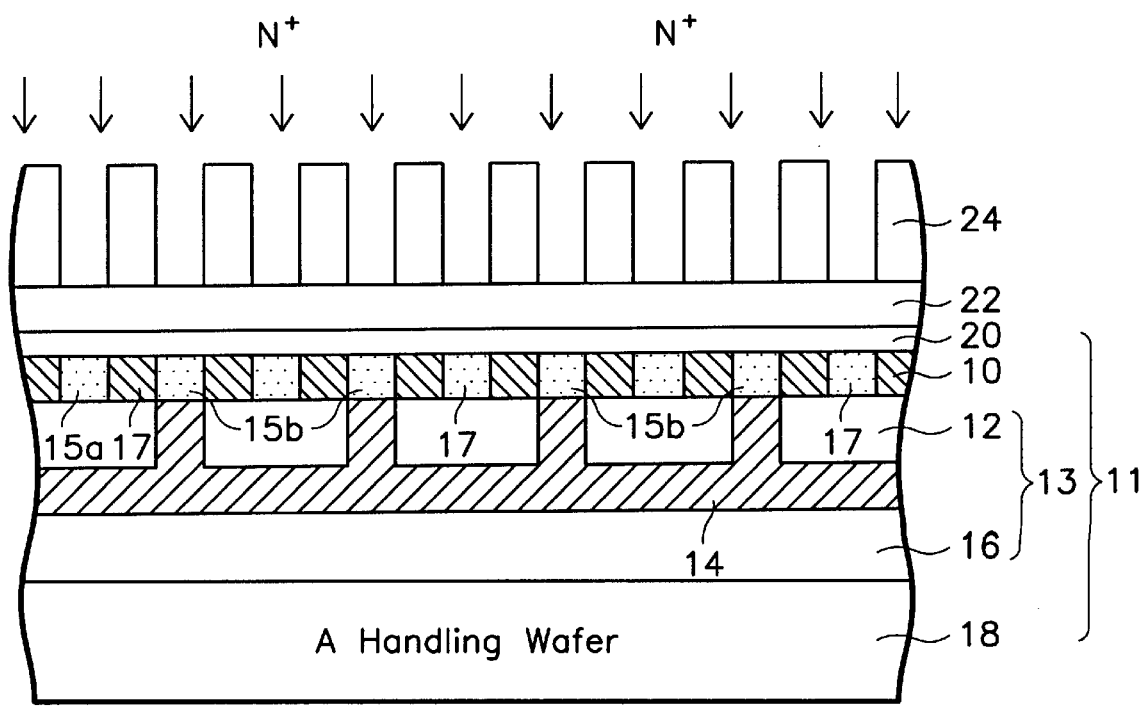

With reference to FIG. 3D, a third insulating layer 20 and a second conductive layer 22 are formed in turn over the semiconductor layer 10. A photoresist pattern 24 is then formed over the second conductive layer 22 in order to define source and drain regions in the semiconductor layer 10. An N-type impurity of a high concentration (N⁺) is implanted through the second conductive layer 22 and the third insulating layer 20 into the semiconductor layer 10, using the photoresist pattern 24 as a mask, at areas that the pattern 24 has not covered. The semiconductor layer 10 thus doped serves as a drain region 15a and a source region 15b, and the layer 10 between the drain and source regions 15a and 15b serves as a channel region 17. As illustrated in FIG. 3D, the first conductive layer 14, i.e., the bit line, is electrically connected to the source regions through the plug.

In this embodiment, the third insulating layer 20, which is used as a gate insulating, layer is preferably made of $TiO_2$ or another high dielectric material, such as $Y_2O_3$, $CeO_2$, $SrTiO_3$, $BaSrTiO_3$, etc, and preferably has a thickness of about 300 Å. The second conductive layer 22 is preferably made of a material selected from a group of $IrO_2$, $RhO_2$, and Pt and preferably has a thickness of about 500 Å.

Figure 3E:
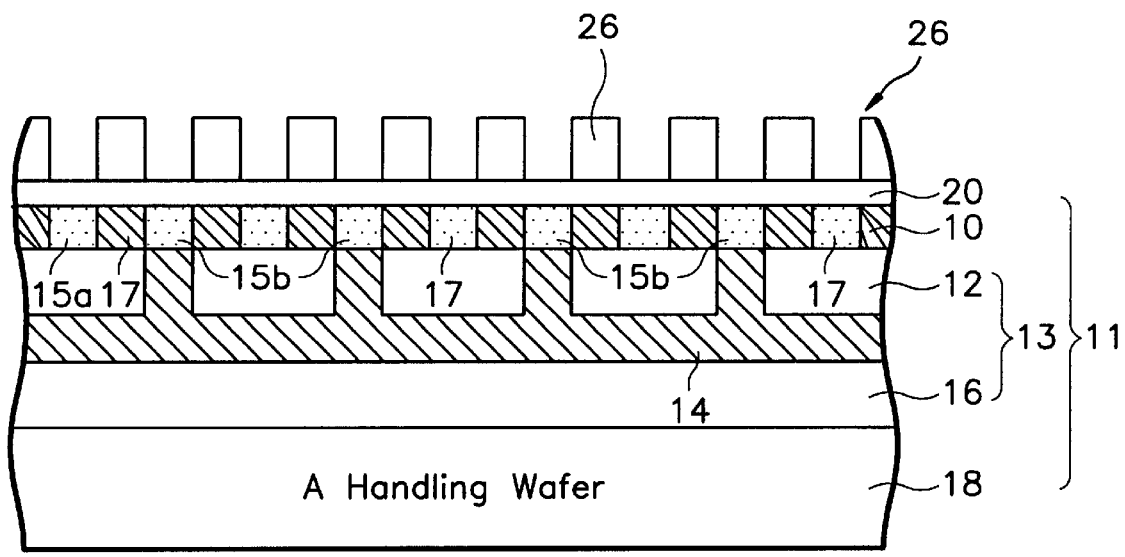
Figure 4:
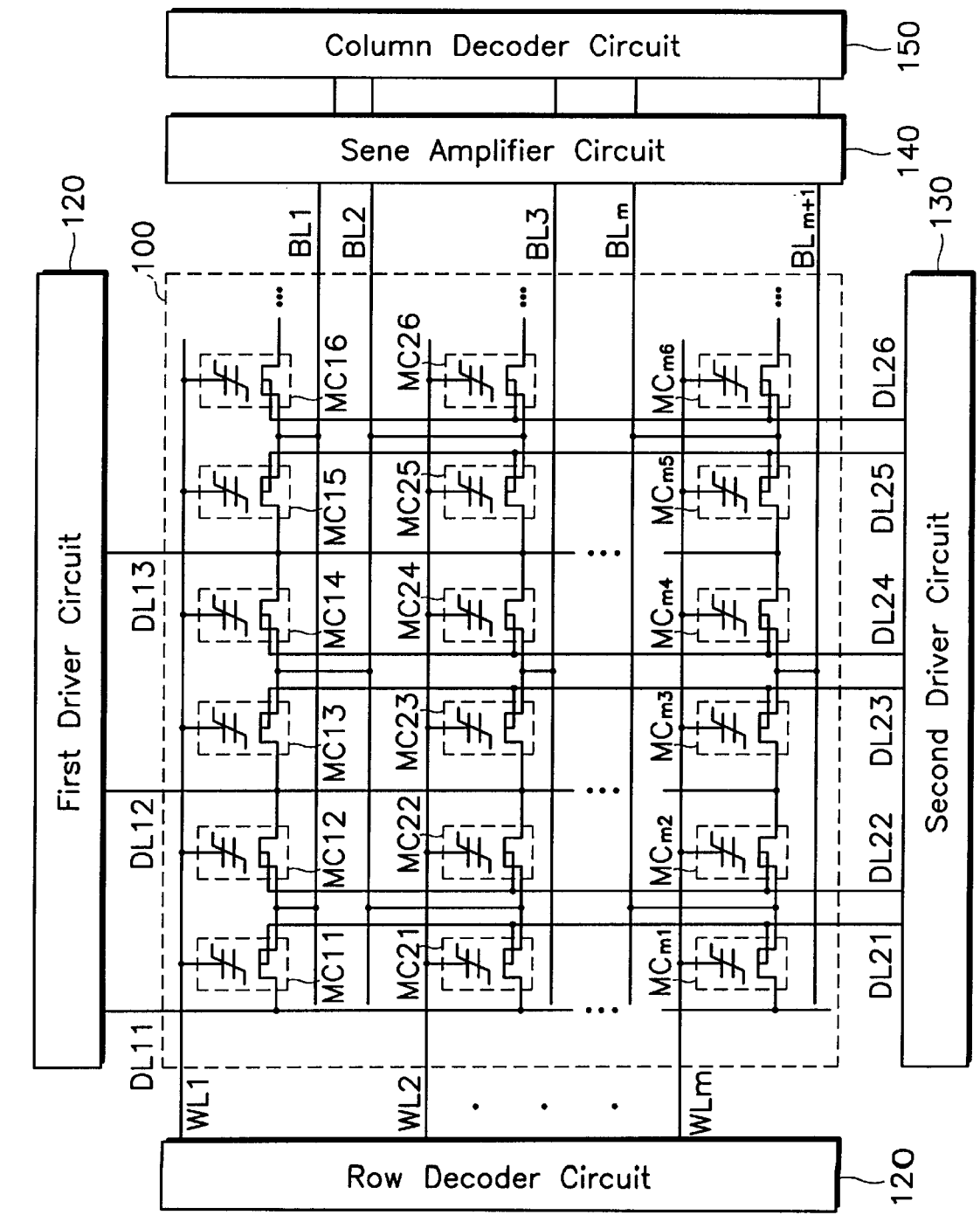
FIG. 4 is a schematic block diagram of a ferroelectric memory device using a MFMIS field effect transistor as a memory cell according to a preferred embodiment of the present invention.

When the photoresist pattern 24 is not removed, a dry etch process is successively performed until a surface of the third insulating layer 20 is exposed, so that a lower electrode 26 (or for use as a gate electrode, as shown in FIG. 4) is formed over the third insulating layer 20 as shown in FIG. 3E. Because the photoresist pattern 24 is hardened during the ion implanting process shown in FIG. 3D, the dry etch process can be performed without a separate photoresist hardening process.

Figure 3F:
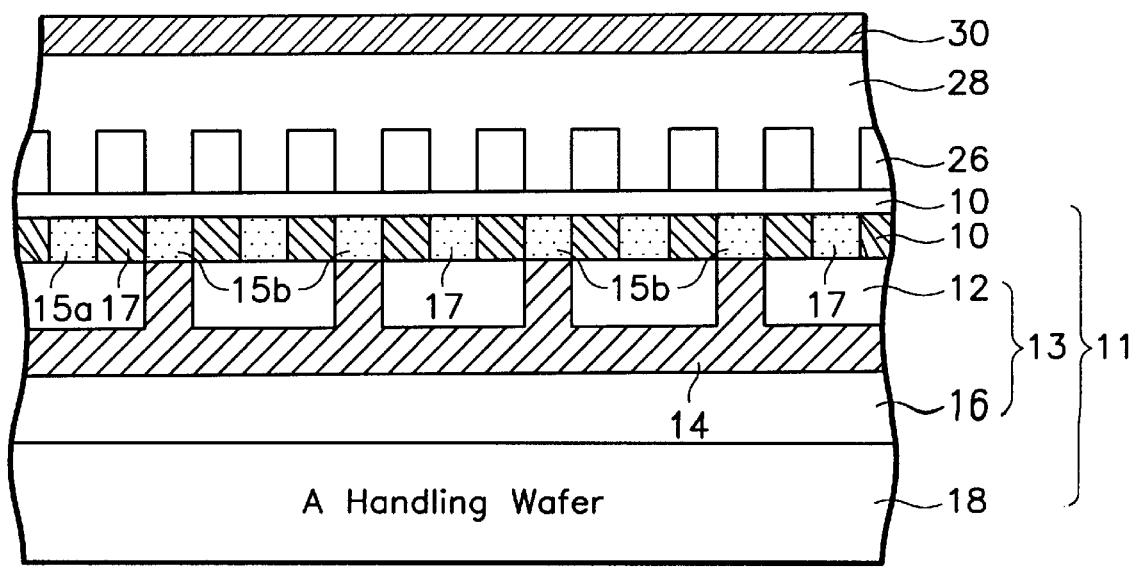

Referring to FIG. 3F, a dielectric layer, i.e., a ferroelectric layer 28, and an upper electrode 30 are formed over the semiconductor layer 10. The ferroelectric layer 28 is formed over an entire cell array area (100, as shown in FIG. 4) without any etching. As a result, it is possible to prevent ferroelectric characteristics from declining due to etching damage.

In this embodiment, we should give attention to the fact that the ferroelectric layer 28 (or material) does not exhibit a required lattice structure uniformly over an entire cell array area 100. In other words, a ferroelectric layer 28 formed over the lower electrode 26 using Pt or $IrO_2$ has a required lattice structure, i.e., a perovskite structure, exhibiting ferroelectric characteristics (the hysterisis characteristics shown in FIG. 1). On the other hand, a ferroelectric layer 28 formed over the third insulating layer 22 has a declined ferroelectric characteristics relative to that on the lower electrode 26. Since the spontaneous polarization and the coercive electric field of the ferroelectric layer 28 formed on the lower electrode 26 are less than that formed on the third insulating layer 22, no interference between adjacent memory cells is caused due to the non-patterned ferroelectric layer 28 (nor it is reduced due to the declined ferroelectric layer 28). According to a preferred fabrication method of the present invention, the critical chemical reaction or the mutual diffusion set forth in the prior art are thus prevented.

FIG. 4 is a schematic block diagram of a ferroelectric memory device having as a memory cell a metal-ferroelectric-metal-insulator-semiconductor field effect transistor manufactured according to the preferred embodiment of the present invention, as shown above. The ferroelectric memory device 1 comprises a memory cell array 100, a row decoder circuit 110, a first driver circuit 120, a second driver circuit 130, a sense amplifier circuit 140, and a column decoder circuit 150.

The memory cell array 100 is composed a plurality of word lines WL1–WLm (m=1, 2, 3, . . . , and so forth), a plurality of bit lines BL1–BL(m+1), first drive lines DL11, DL12, DL13, . . . , DL1n (n=1, 2, 3, . . . , and so forth), second drive lines DL21, DL22, DL23, . . . , DL2n, and a plurality of memory cells MCmn. Each of the memory cells MCmn comprises a "MFMIS" field effect transistor fabricated according to the preferred method of the present invention, described above. Each of the MFMIS field effect transistors MCmn has a drain connected to the first driver circuit 120 through a first corresponding drive line DL1n, a source connected to the sense amplifier circuit 140 through a corresponding bit line BL(m+1), upper electrode, i.e., a word line WL1, connected to the row decoder circuit 110, and a channel connected to the second driver circuit 130 through a second corresponding drive line DL2n.

The bit lines BL(m+1) (14 from FIG. 2) and the word lines WLn (30 from FIG. 2) are preferably arranged at a ratio of 2:1. In other words, memory cells connected to one word line, e.g., WL1, are connected in turn to the two bit lines, for example, BL1 and BL2. Odd ones of source regions 15b shared between memory cells MC1n placed in a same row WL1 (30) are coupled to the bit line BL1, and even ones thereof are tied to the bit line BL2. Referring to FIG. 2 again, a bit line 14 between two word lines 30 is shared by memory cells placed along the word lines 30. The bit lines BL(m+1), as set forth above, are formed in an insulator 13 of the SOI substrate 11.

During a read mode of operation, the first driver circuit 120 supplies a sensing current to a first drive line associated with a selected memory cell under the control of the row decoder circuit 110 and the column decoder circuit 150, and makes other first drivers move to a floating state. The first driver circuit 120 moves all of the first drive lines DL11–DL1n to the floating state during erase and write modes of operation. A second drive line associated with the selected memory cell is grounded under the control of the second driver circuit 130 during the read, erase, and write modes of operation, and the second driver circuit 130 makes other second drive lines remain at the floating state.

A Write Operation

Figure 1:
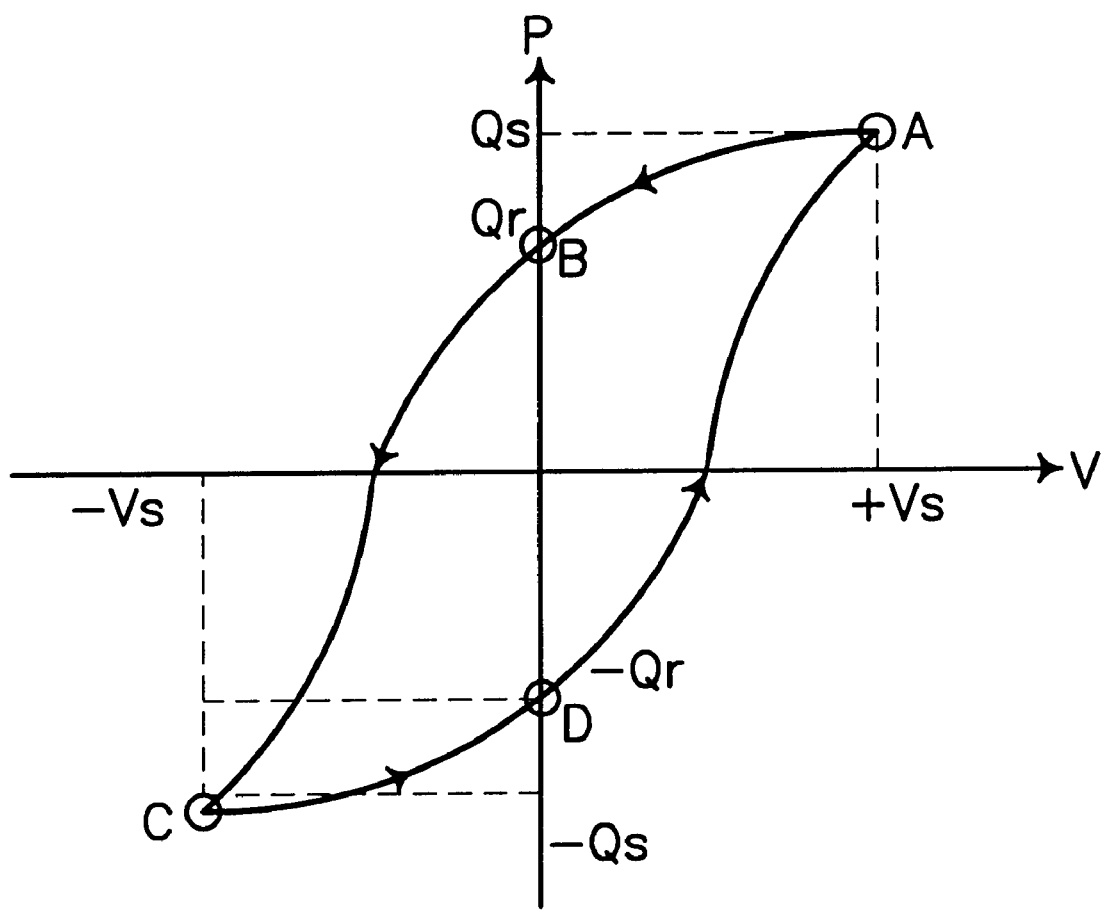
FIG. 1 is a graph showing a hysterisis I-V switching loop of a ferroelectric capacitor.

The write operation of the ferroelectric memory device will be described with reference to the FIGS. 1, 2 and 4. Data '1' means that a selected MFMIS field effect transistor, that is, memory cell, is conducting, and data '0' means that the selected MFMIS field effect transistor, that is, memory cell, is not conducting. Assume that the memory cells MCmn of the ferroelectric memory device 1 are at an initial state of data '0', that is, at a point 'D' of FIG. 1. It will be described below how data '1' is written into the selected memory cell, for example, MC11.

When data '1' is written in the selected memory cell MC11, the row decoder circuit 110 supplies one word line WL1 of the memory cell MC11, i.e., an upper electrode, with a writing voltage. The channel of the selected memory cell MC11 is then grounded by the second driver circuit 130. At the same time, first drive lines DL11–DL1n and second drive line DL22–DL2n move to a floating state through the first and second driver circuits 120 and 130. In this embodiment, the writing voltage is a voltage sufficient for a polarization of the ferroelectric layer to be reversed.

Under this condition, a positive voltage $V_s$ is applied between the upper electrode and the channel (that is, semiconductor layer 10). This positive voltage $+V_s$ is more than a coercive voltage (as describe shown in FIG. 1). All of the polarization domains in the ferroelectric layer 28 of the selected memory cell MC11 are polarized to a point 'A' from a point 'D', so that a negative charge is generated in the channel 17, i.e., over the semiconductor layer 10 between the source and drain regions illustrated in FIG. 3F. This makes the selected memory cell MC11 become a depletion type (normally ON) which is enabled when a voltage applied to the upper electrode (word line WL1) is 0V both in the written condition '1' and in the non-written condition '0'. In other words, data '1' is written in the selected memory cell MC11.

An Erase Operation

Assume that the selected memory cell MC11 stores data '1'. Under this assumption, the erase operation will be described hereinafter in detail.

When the erase operation is performed, the row decoder circuit 110 supplies the word line WL1 connected to the selected memory cell MC11 with an erasing voltage and the channel of the selected memory cell MC11 is grounded by the second driver circuit 130. At the same time, first drive lines DL11–DL1n and second drive line DL22–DL2n move to a floating state through the first and second driver circuits 120 and 130. In this embodiment, the erasing voltage is a voltage sufficient for a polarization of the ferroelectric layer to be reversed and has both a polarity contrary to and at the same level as the writing voltage.

Under this condition, a negative voltage $-V_s$ (shown in FIG. 1), which is less than a coercive voltage $-V_c$, is applied between the upper electrode and the channel (i.e., to the semiconductor layer 10 between the source and drain regions 15b and 15a). All of the polarization domains in ferroelectric layer 28 of the selected memory cell MC11 are polarized to a point 'C', so that a positive charge is generated on the channel 17. This makes the selected memory cell MC11 become an enhancement type (normally OFF) which is disabled when a voltage applied to the upper electrode (word line WL1) is 0V both in the written condition '1' and in the non-written condition '0'. In other words, the selected memory cell MC11 is erased.

A Read Operation

A memory cell, for example, MC11, is selected by the row decoder circuit 110 and the column decoder circuit 150. And then, the row decoder circuit 110 supplies with a reading voltage a word line WL1 associated with the selected memory cell MC11. The first driver circuit 120 supplies a sensing current onto a first drive line DL11, and a second drive line DL21 connected to the channel of the memory cell MC11 is grounded by the second driver circuit 130. At the same time, first drive lines DL12–DL1n and second drive lines DL22–DL2n are placed at the floating state through the first and second driver circuit 120 an 130. In this embodiment, the reading voltage is a voltage at which the polarization of the ferroelectric layer 28 is not reversed.

Under this condition, the sense amplifier circuit 140 senses and amplifies a voltage variation on a bit line BL1 connected to the selected memory cell MC11. If data '1' is stored in the memory cell MC11, i.e., the memory cell MC11 is at a conductive state, a voltage on the bit line BL1 is increased by the amount of the sensing current supplied through the memory cell MC11. Then, the circuit 140 senses and amplifies the changed voltage on the bit line BL1 and so, data '1' is read. In contrast, if data '0' is stored in the memory cell MC11, i.e., the memory cell MC11 is at a non-conductive state, a voltage on the bit line BL1 is not changed because the memory cell MC11 is an OFF state. Then, the circuit 140 senses and amplifies and data '1' is read.

As described above, according to the present invention, a bit line is formed in an insulator of a SOI substrate and a ferroelectric layer is formed at an entire cell array area without etching, so that a ferroelectric lattice structure, that is, perovskite structure, is not destroyed because a critical chemical reaction or a mutual diffusion between a ferroelectric material, such as PZT or SBT, and Si (or $SiO_2$) is prevented. Moreover, in the ferroelectric memory device, read, erase, and write operations are performed by use of a MFMIS field effect transistor as an unit memory cell, so that the area of the chip as the cell decreases.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor memory device comprising:

a silicon-on-insulator substrate including a handling wafer, a first insulating layer and a semiconductor layer stacked in that order;

a first conductive layer for use as a bit line formed at least partially in the first insulating layer, wherein a part of the first conductive layer is electrically coupled to the semiconductor layer;

a source region formed in the semiconductor layer and electrically connected to the first conductive layer;

a drain region formed in the semiconductor layer;

a second insulating layer formed over the semiconductor layer and between the source and drain regions;

a second conductive layer for use as both a lower electrode and a gate electrode formed over the second insulating layer and between the source and drain regions;

a ferroelectric layer formed over the semiconductor layer, wherein the ferroelectric layer is formed over an entire cell array area; and a third conductive layer for use as an upper electrode formed over the ferroelectric layer, wherein writing to memory cells and erasing from memory cells are performed by causing a potential difference between the upper electrode and the semiconductor layer to reverse a polarization of the ferroelectric layer, wherein a single memory cell is formed by only one transistor, and wherein the third conductive layer is connected to a word line and the drain region is connected to a drive line.

2. A ferroelectric memory device comprising:

a silicon-on-insulator substrate including a handing wafer, a first insulating layer, and a semiconductor layer sequentially formed;

a bit line formed in the first insulating layer;

a memory cell having a source formed in the semiconductor layer and connected to the bit line, a drain formed in the semiconductor layer, a lower electrode formed on the second insulating layer, a ferroelectric layer formed over the semiconductor layer, and an upper electrode formed on the ferroelectric layer, wherein the lower electrode, gate insulating layer, drain, and source form a field effect transistor;

a writing circuit for writing data to be written into the memory cell by applying a writing voltage to the upper electrode so as to invert a direction of a polarization of the ferroelectric layer or retain the polarization in an initial direction in accordance with the data; and a reading means for reading data to be read from the memory cell by applying a reading voltage to the upper electrode and by checking whether the field effect transistor is conductive.

3. A nonvolatile memory device as recited in claim 2, wherein the drain and source remain at a floating state when the writing voltage is applied to the upper electrode.

4. A nonvolatile memory device as recited in claim 3, wherein the semiconductor layer between the source and the drain is grounded when the writing voltage is applied to the upper electrode.

5. A nonvolatile memory device as recited in claim 4, wherein the writing voltage is a voltage sufficient for a polarization of the ferroelectric layer to be reversed and the reading voltage is a voltage at which the polarization of the ferroelectric layer is not reversed.

6. A nonvolatile memory device as recited in claim 3, wherein the semiconductor layer between the source and the drain is grounded when the erasing voltage is applied to the upper electrode.

7. A nonvolatile memory device as recited in claim 6, wherein the erasing voltage is a voltage sufficient for a polarization of the ferroelectric layer to be reversed and having both a polarity contrary to and the same level as the writing voltage.

8. A nonvolatile memory device as recited in claim 7, wherein the drain and source remain at a floating state when data stored in the memory cell is erased.

9. A nonvolatile memory device as recited in claim 8, wherein the semiconductor layer between the source and the drain is grounded when the erasing voltage is applied to the upper electrode.

10. A nonvolatile memory device as recited in claim 2, wherein data stored in the memory cell is erased by applying an erasing voltage to the upper electrode so as to invert a direction of a polarization of the ferroelectric layer or retain the polarization in an initial direction.

11. A ferroelectric memory device comprising:

a plurality of word lines;

a plurality of bit lines;

a plurality of memory cells each comprising a transistor including a drain, a source connected to a corresponding bit line and a channel between the source and the drain, and a ferroelectric capacitor including
a lower electrode formed over the channel, and
a ferroelectric layer, and an upper electrode formed on the ferroelectric layer and connected to a corresponding word line, a first driver circuit for supplying a sensing current to a drain of a selected memory cell during a read mode of operation, and for bringing each drain of all of the memory cells to a floating state during write and erase modes of operation;

a second driver circuit for supplying a ground voltage to a channel of the selected memory cell during the read, write, and erase modes of operation, and for bringing channels of deselected memory cells to the floating state;

a row decoder circuit for selecting a word line associated with the selected memory cell, the row decoder circuit supplying a writing voltage to the selected word line during the writing mode of operation, a reading voltage to the selected word line during the read mode of operation, and an erasing voltage to the selected word line during the erase mode of operation, respectively; and a sense amplifier circuit connected to the bit lines, for sensing and amplifying a potential variation on a bit line corresponding to the selected memory cell, wherein a ratio of the word lines to the bit lines is approximately 1:2, wherein the lower electrode serves as a gate electrode of the transistor, and wherein adjacent transistors of memory cells connected to each word line share their sources/drains with each other.

12. A ferroelectric memory device as recited in claim 11, wherein the memory cells are formed on a silicon-on-insulator substrate having a handing wafer, an insulating layer, and a semiconductor layer.

13. A ferroelectric memory device as recited in claim 12, wherein the bit lines are formed in the insulating layer of the silicon-on-insulator substrate.

14. A ferroelectric memory device as recited in claim 11, wherein the writing voltage is a voltage sufficient for a polarization of the ferroelectric layer to be reversed and the reading voltage is a voltage at which the polarization of the ferroelectric layer is not reversed.

15. A ferroelectric memory device as recited in claim 14, wherein the erasing voltage is a voltage sufficient for a polarization of the ferroelectric layer to be reversed, wherein the erasing voltage has a polarity contrary to the writing voltage, and wherein the erasing voltage has a magnitude at the same level as the writing voltage.

16. In a nonvolatile semiconductor memory device comprising a silicon-on-insulator substrate having a handing wafer, a first insulating layer, and a semiconductor layer sequentially formed; a bit line formed in the first insulating layer; a source formed in the semiconductor layer and connected to the bit line; a drain formed in the semiconductor layer; a lower electrode formed over the semiconductor layer between the drain and the source; a ferroelectric layer formed over the semiconductor layer; and an upper electrode formed on the ferroelectric layer, a method of writing data in the nonvolatile semiconductor memory device comprising the steps of:

applying a writing voltage to the upper electrode; and applying a ground voltage to the semiconductor layer between the drain and the source, thereby bringing the drain and the source to a floating state so as to invert a direction of polarization of the ferroelectric layer or retain the polarization in an initial direction in accordance with the data.

17. The method of writing data in a nonvolatile memory system, as recited in claim 16, wherein the writing voltage is a voltage sufficient for a polarization of the ferroelectric layer to be reversed.

18. In a nonvolatile semiconductor memory device comprising a silicon-on-insulator substrate having a handing wafer, a first insulating layer, and a semiconductor layer sequentially formed; a bit line formed in the first insulating layer; a source formed in the semiconductor layer and connected to the bit line; a drain formed in the semiconductor layer; a lower electrode formed on the semiconductor layer between the drain and the source; a ferroelectric layer formed over the semiconductor layer; and an upper electrode formed over the ferroelectric layer, a method of erasing data in the nonvolatile semiconductor memory device comprising the steps of:

applying an erasing voltage to the upper electrode; and applying a ground voltage to the semiconductor layer between the drain and the source, thereby bringing the drain and the source to a floating state.

19. The method of erasing data in a nonvolatile memory system, as recited in claim 18, wherein the erasing voltage is a negative voltage sufficient for a polarization of the ferroelectric layer to be reversed.

20. In a nonvolatile semiconductor memory device comprising a silicon-on-insulator substrate having a handing wafer, a first insulating layer and a semiconductor layer sequentially formed; a bit line formed in the first insulating layer; a source formed in the semiconductor layer and connected to the bit line; a drain formed in the semiconductor layer; a lower electrode formed over the semiconductor layer between the drain and the source; a ferroelectric layer formed over the semiconductor layer; and an upper electrode formed on the ferroelectric layer, a method of reading data stored in the nonvolatile semiconductor memory device comprising the steps of:

applying a reading voltage to the upper electrode;

applying a ground voltage to the semiconductor layer between the drain and the source;

providing a sensing current to the drain; and sensing a potential variation on the bit line.

21. The method of reading data in a nonvolatile memory system, as recited in claim 20, wherein the reading voltage is a voltage at which the polarization of the ferroelectric layer is not reversed.

* * * * *